United States Patent
Saran et al.

(10) Patent No.: US 8,664,639 B2
(45) Date of Patent: Mar. 4, 2014

(54) DISPLAY APPARATUS

(71) Applicant: Samsung Display Co., Ltd., Yongin (KR)

(72) Inventors: Neerja Saran, The Woodlands, TX (US); Woo-Jae Lee, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/659,399

(22) Filed: Oct. 24, 2012

(65) Prior Publication Data

US 2013/0057796 A1   Mar. 7, 2013

Related U.S. Application Data

(62) Division of application No. 12/582,960, filed on Oct. 21, 2009, now Pat. No. 8,310,009.

(30) Foreign Application Priority Data

Oct. 24, 2008  (KR) .......................... 10-2008-0104728

(51) Int. Cl.
- *H01L 29/06* (2006.01)
- *H01L 31/072* (2012.01)
- *H01L 31/0336* (2006.01)
- *H01L 31/0328* (2006.01)
- *H01L 31/109* (2006.01)

(52) U.S. Cl.
USPC ........ 257/13; 257/79; 257/347; 257/E29.273; 257/E31.099

(58) Field of Classification Search
None
See application file for complete search history.

(56) References Cited

U.S. PATENT DOCUMENTS

| | | |
|---|---|---|
| 6,958,492 B2 | 10/2005 | Huang et al. |
| 7,411,085 B2 | 8/2008 | Hirakata et al. |
| 7,575,952 B2 | 8/2009 | Arai et al. |
| 7,642,463 B2 | 1/2010 | Guiheen et al. |
| 7,722,422 B2 | 5/2010 | Cok |
| 8,018,563 B2 | 9/2011 | Jones et al. |
| 8,094,247 B2 | 1/2012 | Allemand et al. |
| 2007/0153363 A1 | 7/2007 | Gruner |
| 2008/0296683 A1 | 12/2008 | Yoon et al. |
| 2009/0022650 A1 | 1/2009 | Choi et al. |

OTHER PUBLICATIONS

Non-Final Office Action issued to related U.S. Appl. No. 12/582,960 dated Apr. 4, 2012.
Notice of Allowance issued to related U.S. Appl. No. 12/582,960 dated Aug. 31, 2012.

*Primary Examiner* — Zandra Smith
*Assistant Examiner* — Khanh Duong
(74) *Attorney, Agent, or Firm* — H.C. Park & Associates, PLC (57) ABSTRACT

A display apparatus includes a first substrate including a plurality of pixels, a first electrode arranged on the first substrate, a second substrate facing the first substrate, and a second electrode arranged on the second substrate and spaced apart from the first electrode, the second electrode to form an electric field in cooperation with the first electrode. At least one of the first and second electrodes includes a transparent conductive nanomaterial having a transmittance of no less than 73% to no more than 100% and a sheet resistance of 0 ohms to 100 ohms.

12 Claims, 10 Drawing Sheets

DISPLAY APPARATUS

CROSS REFERENCE TO RELATED APPLICATIONS

This application is a divisional of U.S. patent application Ser. No. 12/582,960, filed on Oct. 21, 2009, and claims priority from and the benefit of Korean Patent Application No. 10-2008-0104728, filed on Oct. 24, 2008, which are hereby incorporated by reference for all purposes as if fully set forth herein.

BACKGROUND OF THE INVENTION

1. Field of the Invention

The present invention relates to a display apparatus having an electrode that includes transparent conductive nanomaterial.

2. Discussion of the Background

Recently, research and development has been conducted with various flat panel is display apparatuses, including liquid crystal displays (LCDs), organic light emitting displays (OLEDs), and plasma display panels (PDPs). These display apparatuses control a liquid crystal layer, an organic light emitting layer, or a plasma distribution using electrodes formed on transparent substrates thereof. For example, in a liquid crystal display including two substrates and a liquid crystal layer formed therebetween, the liquid crystal layer includes liquid crystal molecules having optical anisotropic property, which are driven by an electric field. The liquid crystal molecules are disposed between two electrodes forming the electric field and aligned in a predetermined direction according to the electric field, thereby changing the light transmittance thereof and displaying images.

Indium tin oxide (ITO) and indium zinc oxide (IZO) may be used as materials in the display panel electrode. However, in order to form the ITO or IZO electrode, a deposition process performed at high temperature may be required and the physical properties of these materials may be difficult to predict. In addition, ITO and IZO may exert influences on other structures of the display panel due to oxygen atoms thereof and may be vulnerable to a wet etch process.

SUMMARY OF THE INVENTION

The present invention provides a display apparatus having improved sheet resistance and transmittance.

The present invention also provides a thin film transistor (TFT) substrate having a transparent conductive electrode including nanowires or metal oxide nanoparticles.

Additional features of the invention will be set forth in the description which follows, and in part will be apparent from the description, or may be learned by practice of the invention.

The present invention discloses a display apparatus including a first substrate including a plurality of pixels, a first electrode arranged on the first substrate, a second substrate facing the first substrate, and a second electrode arranged on the second substrate and spaced apart from the first electrode, the second electrode to form an electric field in cooperation with the first electrode. At least one of the first electrode and the second electrode includes a transparent conductive nanomaterial having transmittance of no less than 73% to no more than 100%, and sheet resistance of 0 ohms per square ($\Omega/\square$) to 100 ohms per square.

The present invention also discloses a thin film transistor (TFT) substrate. The thin film transistor substrate includes a TFT arranged on a substrate and a transparent conductive electrode connected to the TFT. The transparent conductive electrode includes nanowires having a density of 4 particles to 40 particles per 5×5 square micrometer.

The present invention also discloses a TFT substrate. The TFT substrate includes a TFT arranged on a substrate and a transparent conductive electrode connected to the TFT. The transparent conductive electrode includes metal oxide nanoparticles having a density of 400 particles to 3000 particles per 5×5 square micrometer.

The present invention also discloses a TFT substrate. The TFT substrate includes a TFT arranged on a substrate and a transparent conductive electrode connected to the TFT. The transparent conductive electrode includes carbon nanotubes having a density of 4 particles to 150 particles per 5×5 square micrometer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, show exemplary embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
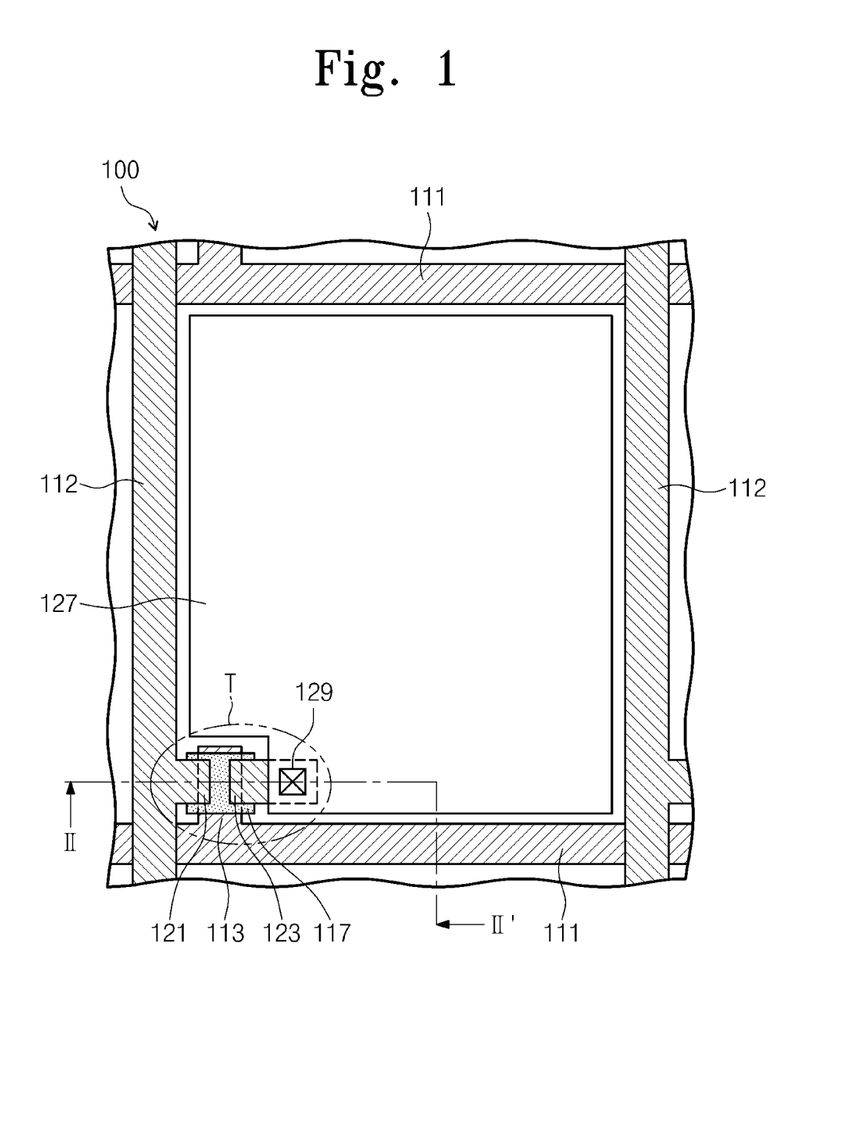
FIG. 1 is a plan view showing a part of a display panel according to an exemplary embodiment of the present invention.
Figure 2:
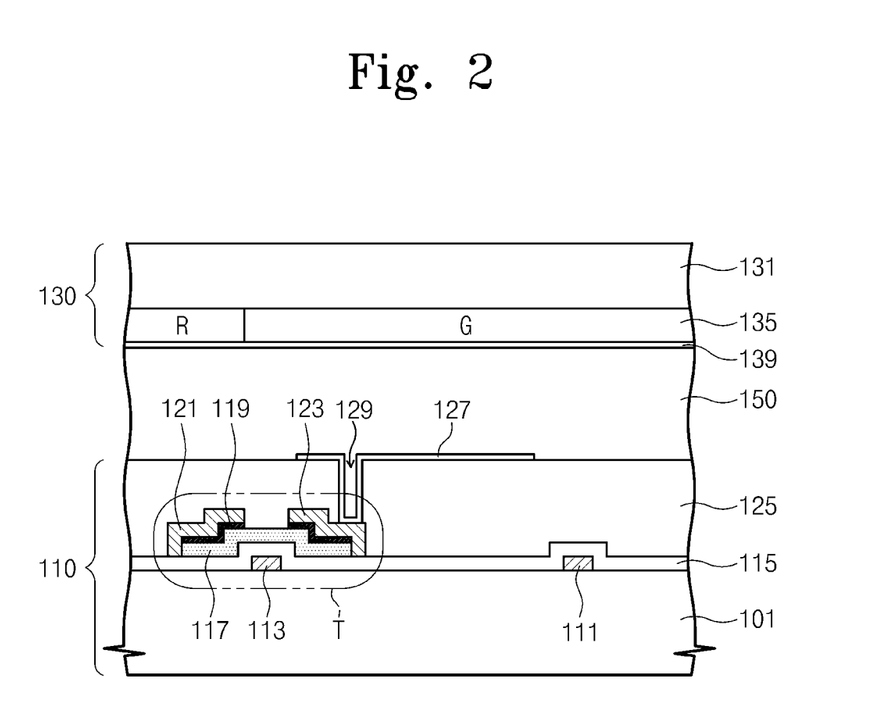
FIG. 2 is a sectional view taken along line II-II' of FIG. 1.

FIG. 1 is a plan view showing a part of a display panel according to an exemplary embodiment of the present invention. FIG. 2 is a sectional view taken along line II-II' of FIG. 1. Although not shown in FIG. 1 and FIG. 2, the display panel includes a plurality of pixels defined by a plurality of gate lines and a plurality of data lines crossing the gate lines. However, in the present exemplary embodiment, for the convenience of explanation, one pixel will be described as a representative example.

Referring to FIG. 1 and FIG. 2, a display panel 100 includes a first substrate 110 and a second substrate 130 facing the first substrate 110. In addition, the display panel 100 may further include a liquid crystal layer 150 (or an electrophoretic layer) disposed between the first substrate 110 and the second substrate 130 to display an image.

The liquid crystal layer 150 includes liquid crystal molecules, which have an optical anisotropy and are aligned in a certain direction in response to a voltage applied thereto, so that desired images are displayed corresponding to the light transmittance of the liquid crystal molecules with respect to light traveling through the liquid crystal layer 150.

In comparison, the electrophoretic layer includes electrophoretic particles, which are dispersed in a liquid and have a charge on their surface. The electrophoretic particles move to a certain area in the liquid in response to a voltage applied thereto, thereby displaying an image.

In the present exemplary embodiment, the display panel 100 will be described on the assumption that the material disposed between the first and second substrates 110 and 130 is the liquid crystal layer 150. However, the scope of the present invention is not limited thereto. That is, the material disposed between the first and second substrates 110 and 130 may be the electrophoretic layer.

The first substrate 110 may be referred to as a TFT substrate when a TFT is formed on the first substrate 110, or may be referred to as a lower substrate when the first substrate is located at a relatively lower position. The second substrate 130 may be referred to as a color filter substrate when a color filter is formed on the second substrate, or may be referred to as an upper substrate when the second substrate is located at a relatively upper position.

The first substrate 110 includes a first insulating substrate 101. The first insulating substrate 101 may include a transparent insulating material such as glass, quartz, plastic, etc.

A plurality of gate lines 111 and a plurality of data lines 112 crossing the gate lines 111 are formed on the first insulating substrate 101 to define a plurality of pixel areas. A thin film transistor T is formed in the pixel area adjacent to the gate lines 111 and the data lines 112. A pixel electrode 127 is formed in the pixel area and connected to the thin film transistor T. The pixel electrode 127 forms an electric field in cooperation with a common electrode 139 to drive the liquid crystal layer 150.

The thin film transistor T includes a gate electrode 113 connected to a corresponding gate line of the gate lines 111, a source electrode 121 connected to a corresponding data line of the data lines 112, and a drain electrode 123 connected to the pixel electrode 127. The thin film transistor T further includes a gate insulating layer 115 to insulate the gate electrode 113 from the source and drain electrodes 121 and 123, and an active layer 117 and an ohmic contact layer 119 to form a conductive channel between the source electrode 121 and the drain electrode 123 when a gate voltage is applied to the gate electrode 113.

A protection layer 125 is formed on the first substrate 110 to cover the thin film transistor T. A contact hole 129 is formed in the protection layer 125 and exposes a portion of the drain electrode 123, so that the pixel electrode 127 may be connected to the drain electrode 123 through the contact hole 129.

The second substrate 130 is disposed to face the first substrate 110 and includes a second insulating substrate 131. The second insulating substrate 131 may include a transparent insulating material such as glass, quartz, plastic, etc.

The second substrate 130 includes a color filter 135 formed on the second insulating substrate 131 to display the color of each pixel. The common electrode 139 is formed on the color filter 135 to form an electric field in cooperation with the pixel electrode 127.

The display apparatus is operated by applying a common voltage to the common electrode 139 that serves as a reference voltage for the liquid crystal molecules, and providing pixel signals from the data line 112 to the pixel electrode 127 via the thin film transistor T in response to scan signals from the gate line 111, resulting in an electric field being formed between the common electrode 139 and the pixel electrode 127. The liquid crystal molecules in the liquid crystal layer 150 are aligned in a certain direction by the electric field, so that the amount of light transmitted through the liquid crystal layer 150 changes, thereby displaying images. The pixel electrode 127 and the common electrode 139 may be referred to as a first electrode and a second electrode, respectively.

ITO may be used for the pixel electrode 127, the common electrode 139, or an anode of an OLED, because of its high transparency and manufacturing experiences gained by the LCD industry. However, properties of ITO may be difficult to control in a deposition process, especially in a deposition process on a plastic substrate. The oxygen atoms in ITO may exert influences on active materials if they are removed from the electrodes. Also, ITO may be vulnerable to a wet etch process, thereby restricting its yield and throughput.

Recently, a process technique in TFT manufacturing using a metal oxide electrode, such as ITO, IZO, or a silicon semiconductor, such as Cu, Cr, Al, Nd, Mo, etc., on a glass substrate has been developed. But since high temperature deposition systems or photolithography patterning schemes may be utilized for the metal oxide electrode, additional processes may be required.

In addition, when a display apparatus is manufactured using a flexible substrate such as plastic sheet, metal foil, paper, etc., electrode materials may be required that can be deposited by a low-temperature coating process, and may have various properties such as transparency, mechanical strength, or the like. Conductive polymers, nanoparticle-based conductive inks, and carbon nanotube-based inks may be used as the electrode materials. In this case, the electrode materials for the display apparatus may have high mechanical strength when they are bent or folded, as well as good transparency (more than about 70% of transmittance) with a low resistance value (about 100Ω/□ or less). The change of sheet resistance may be small or zero at higher temperature, overheating, or short-circuiting of the plastic substrate.

Moreover, the electrode materials for the display apparatus may also have strong chemical tolerance for various organic solvents, durability of heat resistance, excess moisture tolerance, etc. and fulfill stability requirements of the display apparatus. In addition, the electrode materials may be easily patterned by various printing methods such as inkjet printing, gravure printing, thermal printing, rotary printing, or the like, to allow the electrode materials to be easily integrated on paper or plastics as the electrode of the TFT.

Thin metal films deposited at low temperatures, such as Ca/Ag, show low electrical resistance, but are difficult to print using the above-described methods. Similarly, conductive inks of metal materials such as Ag, Au, which are spin-coated or inkjet printed, have shown poor performances as compared with metal materials such as Au, Ag, etc., in a bulk state. This is due to the fact that conductivity of deposited thin metal films is less than that of the metal materials in the bulk state. The conductivity depends upon the shape of the particles of the metal materials, as well as their size and the material content.

Table 1 shows properties of some electrode materials. In table 1, "3" refers to excellent properties, "2" refers to good properties, and "1" refers to poor properties.

TABLE 1

| | carbon nanotube electrode | sputtered ITO | dispersed ITO | dispersed Nano-metal | dispersed intrinsically conducting polymer |
|---|---|---|---|---|---|
| transmittance | 3 | 3 | 2 | 2 | 3 |
| conductivity | 2 | 3 | 1 | 3 | 2 |
| cost | 3 | 2 | 3 | 1 | 2 |
| color | 3 | 2 | 1 | 3 | 2 |
| printability | 3 | 1 | 2 | 1 | 3 |
| flexibility | 3 | 1 | 1 | 3 | 3 |
| stability | 3 | 3 | 3 | 3 | 1 |

Apart from the above described characteristics of conductive electrode materials, a film topology of the electrode materials helps determine the optical performance of the display apparatus including such materials. The film may have various morphologies such as repetitively distributed metal/metal-oxide micro/nano grains, matrix of well dispersed nanowires/nanoparticles of metal, metal oxide, conductive polymers, carbon nanotubes, and so on.

Performance characteristics of an LCD may be determined through various specifications such as viewing angle, brightness, response time, panel size, contrast ratio, resolution, etc. Image artifact is one of the important parameters that determines the overall image quality of the LCD. This is related to optical defects generated in various ways during the manufacturing processes for the LCD.

There are two kinds of image artifacts, spatial and temporal. Some are inherent to the technology used, while others are yield-related and can be reduced or eliminated by optimizing the manufacturing processes. Spatial artifacts include Mura, pixel defects, and cross-talk. Temporal artifacts include image delay, flicker, and motion blur. Pixel defects are mainly a yield issue, and cross-talk is caused by non-optimized driving schemes, TFT leakage currents, RC propagation delays on bus lines, or capacitive coupling between pixels and bus lines.

Exemplary embodiments of present invention mainly focus on reducing the Mura image artifact that denotes local differences in luminance, contrast ratio, and color performance. Mura may be caused by process-related defects such as liquid crystal cell-gap variation caused by non-uniform coating/rubbing of a liquid crystal alignment layer, materials-related defects such as low quality liquid crystal fluid, and material/optical properties of interfacing layers such as transparent ITO electrodes and passivation layers. A surface morphology of a transparent conductor is an important parameter that could affect the optical properties of the LCD.

Liquid crystal molecules are elongated in shape and may have a length of about 2 nm. Because of their elongated, cigar-like shape, they tend to be parallel to each other in the lowest energy state and thus normally exist in bulk as microdroplets. When ITO or IZO electrodes are applied to a conventional active matrix LCD by using a sputtering method, when the microdroplet-based liquid crystal molecules are sandwiched between two transparent conductive electrodes spaced apart from each other by a cell gap of about 5 μm, the liquid crystal molecules may be vertically aligned according to the electric field between the two electrodes and polarized in a specific direction.

New materials have been developed to replace for ITO or IZO used in displays, which are based on microparticles including nanograins, nanotubes, nanowires, and so on. However, the interval between two adjacent nanoparticles such as micrograins, nano tubes or nanowires and the morphology of the nanoparticles exert influence on the morphologies of films when the films are performed by spin-coating, web-coating, gravure-printing or similar techniques instead of sputtering, CVD or evaporation. The light property of displays is influenced by surface morphologies of films. Thus, the interval between two adjacent nanoparticles and the morphology of the nanoparticles are important factor for films in displays.

Figure 3A:
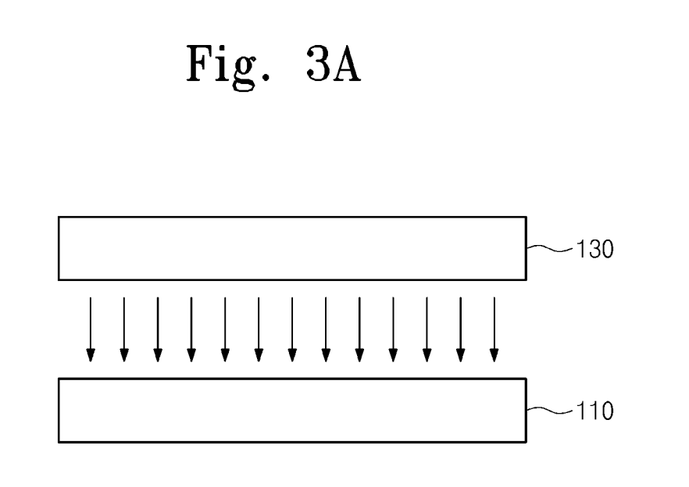
FIG. 3A and FIG. 3B are sectional views showing vertical and lateral electric fields of a display panel, respectively.
Figure 3B:
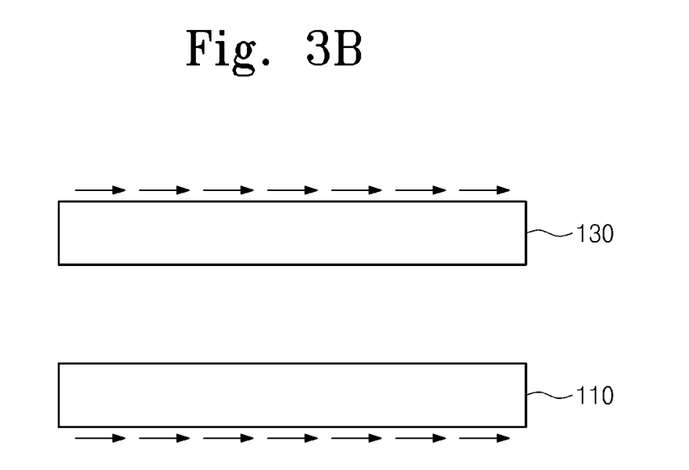

FIG. 3A and FIG. 3B are sectional views showing vertical and lateral electric fields of the LCD, respectively. In a conventional LCD device, a continuous-grain structure of IZO or ITO exerts an influence on a vertical electrical field and a lateral electrical field formed adjacent to two electrodes of the color filter and TFT substrates 110 and 130. Namely, liquid crystal molecules are aligned throughout the LCD according to the features of ITO or IZO films.

In case of films of nanoparticles such as nanotubes and nanowires, a density of the nanoparticles and a uniformity of an interval between two adjacent nanoparticles are important factors in achieving uniform vertical and lateral electric fields as shown in FIG. 3A and FIG. 3B.

When forming an electrode in a form of a transparent conductive film including nanoparticles, vertical and lateral electric fields applied to the liquid crystal molecules may be non-uniform when the density of the transparent conductive film is under a certain range. The non-uniformity of the electric fields means there may be non-uniformity of nanoparticle density as well as non-uniformity of intervals between adjacent nanoparticles. Thus, when a transparent conductive film has less than a certain density value, even though the value fulfills the basic electrical and optical requirements of an electrode such as a common electrode, the interval and the density in the film may cause 'micro Mura.' The micro Mura affects the overall contrast ratio of the display apparatus.

When using a transparent conductive film including nanoparticles as an electrode in an electrophoretic display, a contrast ratio of the electrophoretic display decreases with a thin film density under a certain range. In case of a low density thin film, an interval between adjacent nanoparticles may be greater than a size of an electrophoretic microcapsule of about 20 μm to about 40 μm. The interval causes a partial charge of the electrophoretic microcapsules in both white and black states when an electric field is applied to the electrophoretic microcapsules. Hence, an overall contrast ratio of the electrophoretic display decreases. In order to support a required contrast ratio, an additional voltage is required, resulting in greater power consumption.

On the contrary, when the transparent conductive film including nanoparticles has a density over a certain range, transmittance decreases and the contrast ratio decreases, thereby causing deterioration in image quality.

Therefore, it is important to determine the density of nanoparticles such as nanowires and carbon nanotubes when using the transparent conductive film as the electrode, to determine a balance between optical and electrical properties while maintaining transmittance or sheet resistance adequately. The transparent conductive film may satisfy the condition of sheet resistance of about 1000 ohms per square or less and transmittance of about 70% or more in order to be used as the electrode. When the transparent conductive film satisfies the sheet resistance and the transmittance conditions, an additional voltage to drive the nanoparticle electrode may not be required even when the transparent conductive film has a low density. In addition, a significant reduction in display brightness may not occur even when the transparent conductive film has a high density.

Metal nanowires, metal oxide nanoparticles, carbon nanotubes, and so on may be used as nanoparticles that may form a transparent conductive film.

Metal nanowires have an average diameter of about 20 nm and have no bundling effect, so that each nanowire is present individually. Carbon nanotubes are carbon-based nanoparticles and composed entirely of carbon. Most carbon nanotubes have a cylindrical shape. When the carbon nanotubes have a spherical shape or an ellipsoid shape, they are referred to as fullerenes.

Carbon nanotubes are classified into single-walled nanotubes, double-walled nanotubes, and multi-walled nanotubes, which are adjusted to obtain various electrical or optical properties. Ink-based nanotubes are typically produced by technology using solvents or surfactants, and may be coated over wide regions using a non-vacuum apparatus, such as a spray, roll, slit, spin coater, inkjet, etc.

Carbon nanotubes exist in a form of bundles of single carbon nanotubes. The single carbon nanotubes include both a metallic type and a semiconductor type in which its conductivity is degraded. The metallic type carbon nanotubes and the semiconductor type carbon nanotubes exist in the single carbon nanotubes by a ratio of 1:3. The bundles typically have diameters in the range between about 5 nm and about 100 nm. When using the carbon nanotubes as the electrode in the form of a transparent conductive film for a display apparatus, a density of the carbon nanotubes depends on a coating process. In addition, the density of the carbon nanotubes for the electrode should be three or five times that of metal nanowires in order to make the carbon nanotubes have a similar conductivity to that of nanowires.

Metal oxide nanomaterials are referred to as nanoparticles and include metal oxide nanoparticles such as $TiO_2$, $RuO_2$, $SrRuO_2$, and so on. For example, sol-gel thin film based on ITO and Indium-doped ZnO may be used as the electrode in the form of the transparent conductive film. The ITO metal oxide nanoparticles in the transparent conductive film have a density of about 50 particles to about 80 particles per square micrometer, which is ten times the density of nanowires.

The nanoparticles may be used to form a transparent conductive film. The nanoparticles may be prepared by a non-vacuum process to have a metallic property, such as conductivity over 1 S/cm. However, since the nanoparticles used to form the transparent conductive film have various conductivities according to the kind of the nanoparticles, a distribution of the nanoparticles in terms of a density should be controlled to reach the sheet resistance and the transmittance suitable for the electrode of a display apparatus.

Hereinafter, a density range of nanoparticles used for the transparent conductive film as the electrode for the display apparatus according exemplary embodiments of the present invention will be described.

Table 2 shows sheet resistance and transmittance in relation to a density of metal nanowires at a cell gap of 5 μm. Metal nanowires were formed in a form of transparent conductive film as an electrode for an LCD, and then the sheet resistance and the transmittance were measured. The density value in Table 2 refers to the average number of metal nanowires per 5×5 square micrometers. Numbers in parentheses refer to rough numbers of nanowires per square micrometer.

TABLE 2

| Density | sheet resistance (Ω/□) | transmittance (%) |
|---|---|---|
| 0 (1 or less) | — | 92 |
| 5~10 (1~2) | 150~500 | 85~92 |
| 10~25 (2~5) | 75~150 | 80~85 |
| 25~40 (5~8) | 25~75 | 80~75 |
| 50 (10 or more) | 10~30 | 75 or less |

Referring to Table 2, as the density of metal nanowires increases, the sheet resistance and the transmittance decrease. As the density of metal nanowires decreases, the sheet resistance and the transmittance also increase.

When the density of the metal nanowires is zero in Table 2, it means that one particle or no particle exists per square micrometer. In this case, although the sheet resistance is not shown in the Table 2 when the density of the metal nanowires is zero, the sheet resistance is too high, for example, mega ohms, to drive the LCD, so that the metal nanowires are not suitable for the electrode.

Similarly, in case that the density of the metal nanowires is 40 particles or more per 25 square micrometers, for example 50 particles per square micrometer as shown in Table 2, the transmittance is of 75% or less. In this case, although the sheet resistance is low enough to drive liquid crystal molecules, the brightness of the display apparatus becomes too low due to the transmittance of 75% or less.

Figure 4:
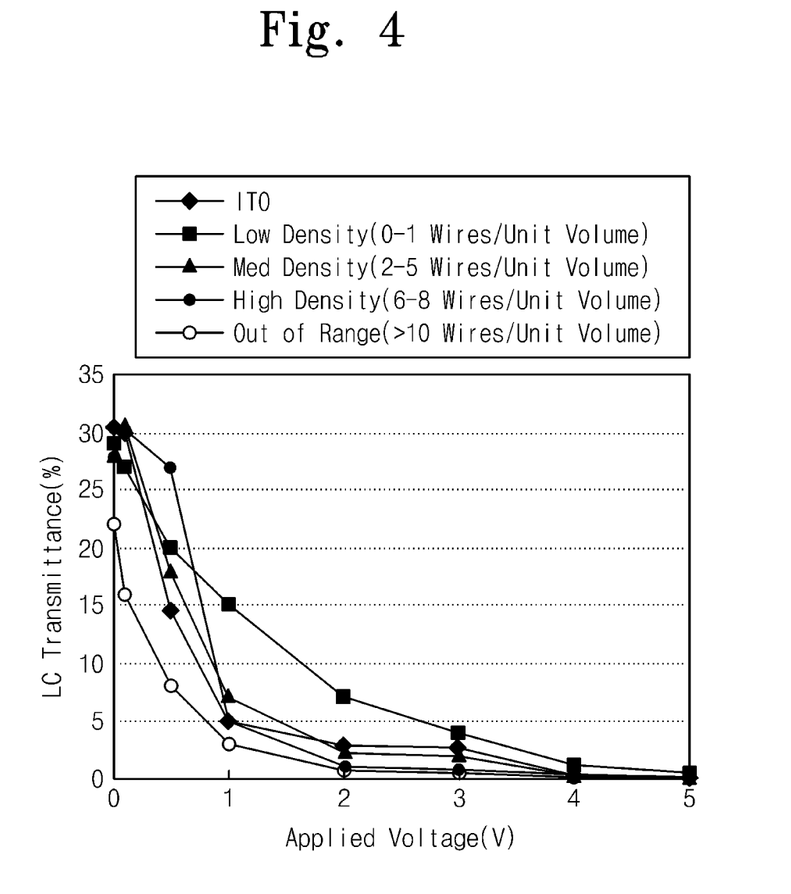
FIG. 4 is a graph showing transmittance of nanowires in relation to a gray scale voltage applied to a display panel having a cell gap of about 5 μm.

FIG. 4 is a graph showing transmittance of metal nanowires in relation to an applied gray scale voltage at a cell gap of 5 μm.

In general, in order to use a transparent conductive film as an electrode of an LCD, the transmittance of the transparent conductive film should be over a certain level when no voltage (0V) is applied to keep the gray scale, and should be reduced enough when a low voltage is applied to display a black color.

Referring to FIG. 4, as a density of metal nanowires increases, reduction in transmittance occurs at a low gray scale voltage. However, the transmittance is not reduced enough to display the black color when an electrode has too low density of the metal nanowires, for example, 0~1 particles per square micrometer. Therefore, the metal nanowires in low density are not suitable for the transparent conductive film because the black color is difficult to obtain.

On the other hand, the electrode having a very high density of the metal nanowires (referred to as 'out of range' in FIG. 4), for example, 10 particles or more of the metal nanowires per square micrometer, is able to produce the black color in high quality since the transmittance is reduced enough to display the black color even when a low gray scale voltage is applied. However, when no voltage (0V) is applied, the transmittance is too low to display an image, so that the electrode having the very high density of metal nanowires is not also suitable for the display apparatus.

Table 3 shows sheet resistance and transmittance in relation to a density of metal oxide nanoparticles at a cell gap of 5 μm. The metal oxide nanoparticles were formed in a form of transparent conductive film as an electrode for an LCD, and then the sheet resistance and the transmittance were measured. The density value in Table 3 refers to average number of the metal oxide nanoparticles per 5×5 square micrometers. Numbers in parentheses refer to rough numbers of the metal oxide nanoparticles per square micrometer.

TABLE 3

| Density | sheet resistance (Ω/□) | transmittance (%) |
|---|---|---|
| 500~1300 (100~260) | 600~1000 | 89~84 |
| 1300~2250 (260~450) | 600~400 | 84~79 |
| 2250~3000 (450~600) | 400~250 | 79~75 |

Referring to Table 3, as the density of metal oxide nanoparticles increases, the sheet resistance and the transmittance decrease. The sheet resistance and the transmittance increase as the density of metal oxide nanoparticles decreases.

When the transparent conductive film has a density of 500 metal oxide nanoparticles or less per square micrometer, the transparent conductive film has the transmittance of about 89% or more, resulting in high transmittance. In this case, however, since the transparent conductive film has a kilo-ohm scale sheet resistance, i.e. 1000 or more, the transparent conductive film is difficult to use as the electrode for the display apparatus.

On the contrary, in case of the transparent conductive film having the density of 3000 metal oxide nanoparticles or more per square micrometer, the transparent conductive film has the transmittance of about 75% or less, so that the transparent conductive film is not appropriate to be used as an electrode for the display apparatus, even though the sheet resistance of the transparent conductive film is sufficiently low.

Figure 5:
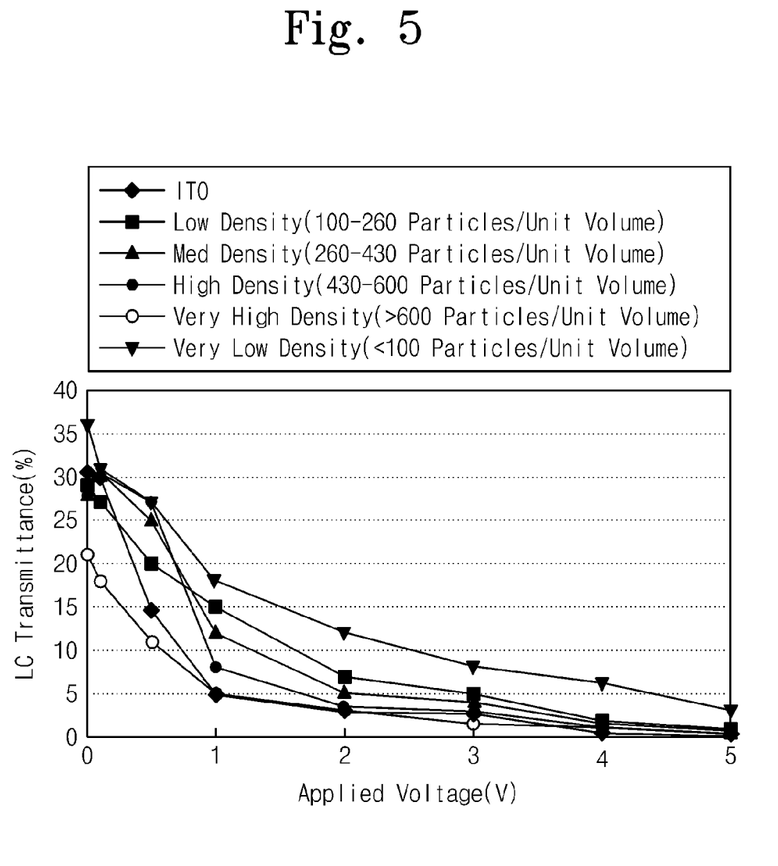
FIG. 5 is a graph showing transmittance of metal oxide nanoparticles in relation to a gray scale voltage applied to a display panel having a cell gap of about 5 μm.

FIG. 5 is a graph showing transmittance of metal oxide nanoparticles in relation to an applied gray scale voltage at a cell gap of 5 μm.

Similar to the metal nanowires, in order to use the metal oxide nanoparticles as the electrode of the display apparatus, the transmittance of the transparent conductive film should be over a certain level even when no voltage (0V) is applied to keep the gray scale, and should be reduced enough even when a low voltage is applied to display the black color.

Referring to FIG. 5, when the transparent conductive film has a very low density of metal oxide nanoparticles, for example, 100 particles or less per square micrometer, the transmittance of the transparent conductive film does not decrease enough even though a voltage is applied thereto. This means that displaying the black color is difficult at very low density, so that the transparent conductive film having the very low density is not appropriate for the electrode of the display apparatus.

On the other hand, the transparent conductive film having a very high density of metal oxide nanoparticles, for example, 600 particles or more of metal oxide nanoparticles per square micrometer, is able to display the black color even though a small gray scale voltage is applied thereto. However, the transparent conductive film having the very low density of the metal oxide nanoparticles is not appropriate for the electrode of the display apparatus since transmittance is low when no voltage is applied thereto.

Table 4 shows sheet resistance and transmittance in relation to a density of carbon nanotubes at a cell gap of 5 μm. The carbon nanotubes were formed in a form of transparent conductive film as an electrode for an LCD, and then the sheet resistance and the transmittance were measured. The density value in Table 4 refers to average number of carbon nanotubes per 5×5 square micrometers. Numbers in parentheses refer to rough numbers of carbon nanotubes per square micrometer.

TABLE 4

| Density | sheet resistance (Ω/□) | transmittance (%) |
|---|---|---|
| 20~60 (4~12) | 400~800 | 88~83 |
| 60~100 (12~20) | 250~400 | 83~78 |
| 100~150 (20~30) | 150~250 | 78~73 |

Referring to Table 4, as the density of carbon nanotubes increases, the sheet resistance and the transmittance decrease. As the density of carbon nanotubes decreases, the sheet resistance and the transmittance increase.

The transparent conductive film to which the carbon nanotubes are applied, similar to the metal nanowires and the metal oxide nanoparticles, has a transmittance of about 88% or more at a low density (under 4 particles or less per square micrometer). But since the transparent conductive film has a high sheet resistance of kilo-ohm, the transparent conductive film is difficult to use for the electrode of the display apparatus.

On the contrary, when the transparent conductive film has a high density of carbon nanotubes, for example 30 particles or more per square micrometer, the transparent conductive film having the high density is not appropriate for the electrode of the display apparatus since the transparent conductive film has a low transmittance of about 73% or less even though its sheet resistance is sufficiently low.

Figure 6:
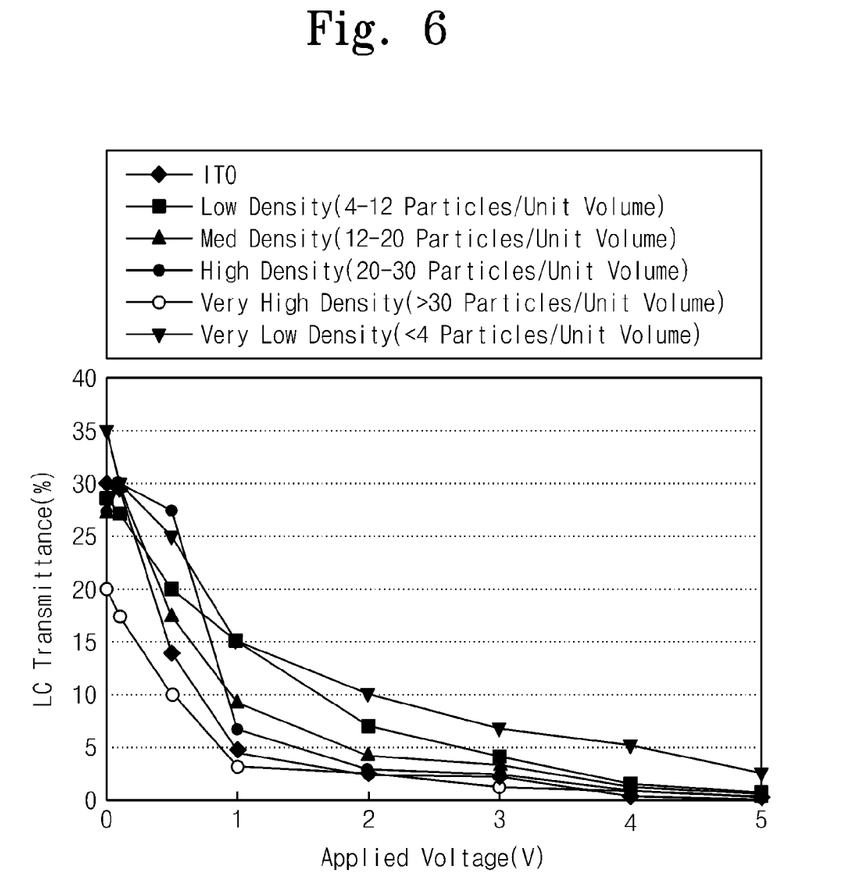
FIG. 6 is a graph showing transmittance of carbon nanotubes in relation to a gray scale voltage applied to a display panel having a cell gap of about 5 μm.

FIG. 6 is a graph showing transmittance of carbon nanotubes in relation to an applied gray scale voltage at a cell gap of 5 μm.

As shown in FIG. 6, as the density of the transparent conductive film increases, the transmittance may be lowered under the low gray scale voltage similarly to the metal nanowires or the metal oxide nanoparticles. However, the transmittance of a transparent conductive film may be kept over a certain level in order to maintain the gray scale when no voltage is applied thereto.

In the present example, the transmittance does not decrease enough to display the black color even though a voltage is applied while the transparent conductive film has a very low density of carbon nanotubes, for example, 4 particles or less per square micrometer. The transparent conductive film is not appropriate for the electrode of the display apparatus.

On the other hand, the transparent conductive film having the high density of carbon nanotubes, for example, 30 particles or more of carbon nanotubes per square micrometer, is able to display the black color even though the small gray scale voltage is applied thereto. However, the transparent conductive film is not appropriate for the electrode of display apparatus since transmittance is low when no voltage is applied thereto.

As described above, the nanoparticles for the transparent conductive film used as the electrode for the display apparatus have a density value within a certain range.

Table 5 shows the density range and the transmittance of nanoparticles.

TABLE 5

|  | conductivity (S/cm) | density at a cell gap of 5 μm (D: diameter, L: length) |
|---|---|---|
| metal nanowires | 1000~2000 | 5~40 particles (D: 20 nm, L: 1 μm) |
| metal oxide nanoparticles | <100 | 500~3000 particles (D: 20 nm) |
| carbon nanotubes | 400~1500 | 20~150 particles (D: 20 nm, L: 1 μm) |

Table 6 shows an adequate range of the density of nanoparticles at a cell gap of about 4 to about 6 μm according to the exemplary embodiments described above. The density value refers to an average number of nanoparticles per 5×5 square micrometers.

TABLE 6

|  | cell gap | | |
|---|---|---|---|
|  | 4 μm | 5 μm | 6 μm |
| metal nanowires | 4~20 | 5~40 | 6~40 |
| metal oxide nanoparticles | 400~2400 | 500~3000 | 600~3000 |
| carbon nanotubes | 12~147 | 20~150 | 20~157 |

The distribution of the density for the transparent conductive film depends on the conductivity of the nanomaterials as shown in Table 5. The conductivity of the transparent conductive film is related to the sheet resistance necessary to apply electrical signals to liquid crystal molecules at a specific cell gap. Moreover, in order to maintain a constant level of electrical signals applied to the liquid crystal molecules while the cell gap increases, the transparent conductive film should have sufficient conductivity.

The density of the transparent conductive film is about ten or less to about several thousands to satisfy the conductivity and the sheet resistance requirements for the electrode of the display apparatus. The transparent conductive film having the appropriate density range may also be used in various fields such as flat panel displays, solar cells, radio-frequency identification (RFID), and so on.

In the transparent conductive film having the density described in Table 6, an interval between two adjacent nanoparticles may cause Mura defects, for example, non-uniformity of sheet resistance or transmittance.

When an average interval between adjacent nanowires in the transparent conductive film is less than a cell gap (e.g. about 5 μm) or more closer to domains of liquid crystal molecules, which are normally of about 0.3 to about 1 μm, Mura may be reduced or be totally removed. In this case, the transmittance of the transparent conductive film is about 80% to about 85% at a wavelength of about 550 nm.

When the interval becomes smaller than about 0.2 μm, the transmittance is below 50% even though Mura does not occur, thereby reducing the brightness of the display apparatus below working range.

When the interval is higher than the cell gap of about 5 μm, Mura occurs even though the transmittance is above 85%. The Mura results from non-uniformity of the nanoparticles. When the interval between adjacent nanowires is about 30 μm, the nanoparticles are not appropriate for the display apparatus since Mura may occur even when the transmittance is about 90%.

Table 7 shows optimized intervals between two adjacent nanoparticles according to the kind of nanomaterial used in the transparent conductive film.

TABLE 7

|  | cell gap | | |
|---|---|---|---|
|  | 4 μm | 5 μm | 6 μm |
| metal nanowires | 1~0.2 | 1~0.2 | 1~0.2 |
| metal oxide nanoparticles | $0.01~1.6 \times 10^{-3}$ | $0.01~2 \times 10^{-3}$ | $0.01~2.3 \times 10^{-3}$ |
| carbon nanotubes | 0.33~0.027 | 0.33~0.033 | 0.33~0.038 |

Referring to Table 7, the transparent conductive film was prepared by spin-coating using high-concentrated ink, resulting in a density of nanowires of about 5 to about 25 particles per square micrometer, an interval between adjacent nanowires of about 1 to about 5 μm, a sheet resistance of about 200Ω/□, and a transmittance of 80%. As a result, Mura was reduced in the transparent conductive film.

Further, the conductivity is maintained with a higher density of 30 nanowire particles/μm2, but the transmittance is reduced drastically under about 73%. The transparent conductive film having the transmittance under about 73% is not appropriate for the display apparatus since the transmittance of about 73% is lower than that required for the display apparatus, which may thereby cause a decrease in the overall image quality of the display apparatus.

The transparent conductive nanomaterials according to the exemplary embodiments of the present invention may be used for the electrode by itself, but if necessary, a nanocomplex in which the nanoparticles are connected to each other by the binder may be used for the transparent conductive film.

The carbon nanotubes or the metal nanowires among transparent conductive nanomaterials have an aspect ratio of 10 or more. Hence, the transparent conductive film of the carbon nanotubes or the metal nanowires may have the appropriate conductivity depending on whether the network structure exists in each nanoparticle.

However, although the electrode of the carbon nanotubes or the metal nanowires appears to be formed uniformly when seen with a macroscopic view, the electrode has substantial non-uniformity when seen with a microscopic view. For example, a silver nanowire film has uniformity in terms of arrangements of the nanoparticles with a macroscopic view. However, with a microscopic view using a scanning electron microscope (SEM), the silver nanowire film has intervals between silver nanowires that are non-uniform. The interval non-uniformity may be observed over the transparent conductive film with a microscope.

For the observance of the interval non-uniformity, after a transparent conductive film is formed on substrates with high-density silver nanowires, a photosensitive or thermosetting resin is coated over a surface of the transparent conductive film in order to improve adhesion between the transparent conductive film and an alignment layer. The alignment layer including polyimide is coated over the resin, and then the alignment layer is rubbed. The substrates are assembled to each other by using a photosensitive sealant surrounding liquid crystal molecules interposed between the substrates. After the sealant is cured by light, polarizers are attached on the substrates, respectively to complete the liquid crystal display. When observing the LCD with a microscope, the non-uniformity of the image is found, which may be caused by the non-uniform alignment of the liquid crystal molecules.

The non-uniformity of the liquid crystal molecule alignment shows that microscale non-uniformity may exist even in a high-density nanowire film and may form texture that exerts influence on visibility of the LCD. Hence, reducing microscale non-uniformity of nanomaterials may be required, in order to use the nanomaterials in a transparent conductive film, especially for a high resolution LCD.

Therefore, in an exemplary embodiment of the present invention, the nanocomplex based on the transparent conductive nanomaterials may be used as the material for the electrode of the display apparatus in order to reduce the non-uniformity of the nanomaterials.

Figure 7A:
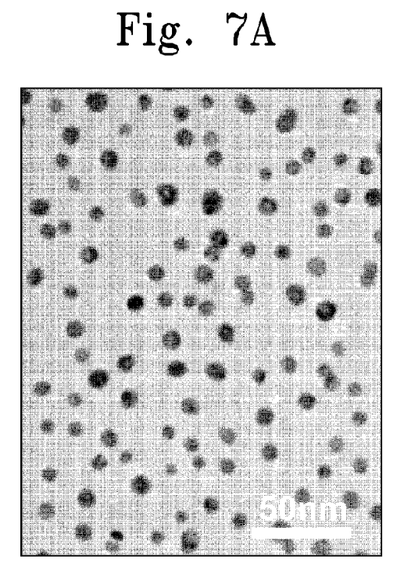
FIG. 7A is a photograph showing gold-silver nanoparticles as a representative nanomaterial.
Figure 7B:
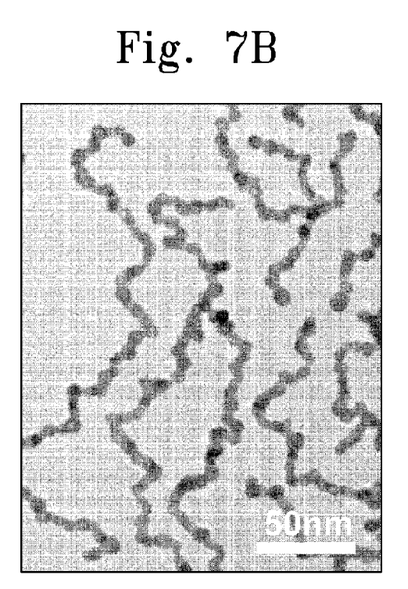
FIG. 7B is a photograph showing gold-silver nanocomplex of the gold-silver nanoparticles.

FIG. 7A is a photograph showing gold-silver nanoparticles as a representative nanomaterial. FIG. 7B is a photograph showing a gold-silver nanocomplex comprising gold and silver nanoparticles.

As shown in FIG. 7A and FIG. 7B, the nanocomplex has a high aspect ratio. Due to the high aspect ratio, the nanocomplex also has high flexibility as well as small a range of intervals between nanowires compared with a range of intervals between individual nanoparticles. The small range of the intervals results from the network structure of nanoparticles that are randomly connected to each other. In addition, since the interval between adjacent nanocomplexes is less than the interval of the individual nanowires, which are in the form of particles, the nanocomplex of nanowires has haziness of about 0.1% with transmittance of 90% or more. On the contrary, the nanowires in the form of individual particles have haziness of at least 1%.

The nanoparticles may be formed by using various schemes. For example, a technology based on biological templates using a nucleation process for uniform growth of metal nanowires may be used. The nanowires in the nucleation process are produced while a conductive precursor or a seed is converted to conductive nanoparticles that bind to the biological templates. The seed may be Ni, Cu, Pd, Co, Pt, Ru, Ag, Co alloys, or Ni alloys. Metals, metal alloys, and metal oxides may be plated on the seed and may include Cu, Au, Ag, Ni, Pd, Co, Pt, Ru, W, Cr, Mo, Ag, Co alloys (e.g., CoPt), Ni alloys, Fe alloys (e.g., FePt), $TiO_2$, $Co_3O_4$, $Cu_2O$, $HfO_2$, ZnO, vanadium oxides, indium oxide, aluminum oxide, indium tin oxide, nickel oxide, copper oxide, tin oxide, tantalum oxide, niobium oxide, vanadium oxide or zirconium oxide, but the present invention is not limited thereto. The biological templates include proteins, peptides, phages, bacteria, viruses, and the like. The technology based on the biological templates is also referred to as 'mineralization' or 'plating'. For example, a metal precursor (e.g., a metal salt) can be converted to an elemental metal in the presence of a reducing agent. As a result, the elemental metal binds to the biological templates and grows into a continuous metallic layer.

The silver nanowires prepared by the above technology have a uniform diameter of about 20 nm and a length of several microns.

A second technology is based on a polyol process for a mass production of silver nanowires with a uniform diameter. The second technology involves the reduction of silver nitrate by ethylene glycol in the presence of polyvinylpyrrolidone (PVP). When the silver nitrate is reduced in the presence of seeds (Pt or Ag particles of a few nanometers), the silver nanoparticles with a bimodal size distribution are generated in a reaction mixture via heterogeneous and homogeneous nucleation processes, respectively. With the second technology, the silver nanowires, each of which having a diameter of about 30 to about 60 nm and a length of about 1 to about 50 μm, are obtained. Namely, by using the second technology, the mass production of the silver nanowires, each of which have a diameter of about 15 to about 25 nm and a length of tens of micrometers, may be available. In addition, in the presence of gemini surfactant 1,3-bis(cetyldimethylammonium) propane dibromide (16-3-16), the nanowires, each of which having an uniform aspect ratio above about 2000, may be obtained.

Various technologies may be used to produce nanotubes in sizeable quantities, such as arc discharge, laser ablation, high pressure carbon monoxide (HiPCO), and CVD, or the like. These processes in general take place in a vacuum or with process gases. Large quantities of nanotubes can be synthesized using a catalysis process and a continuous growth process. For synthesis of the carbon nanotubes, some kinds of catalysts can be used. Among the above-described technologies, laser ablation and CVD have shown to have high yield and good control performance on the diameter of the nanotubes.

Hereinafter, a method of manufacturing the display apparatus according to an exemplary embodiment of the present invention will be described with reference to FIG. 8A, FIG. 8B, FIG. 8C, FIG. 8D, and FIG. 8E.

FIG. 8A, FIG. 8B, FIG. 8C, FIG. 8D, and FIG. 8E are sectional views sequentially showing a method of manufacturing a display apparatus according to an exemplary embodiment of the present invention.

Figure 8A:
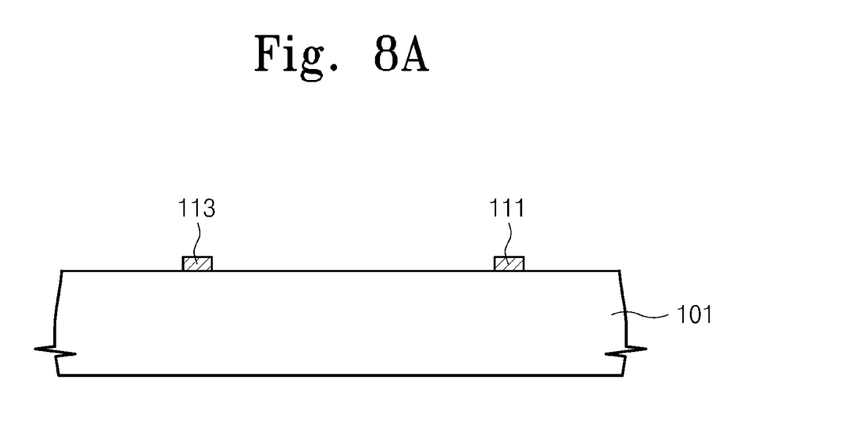
FIG. 8A, FIG. 8B, FIG. 8C, FIG. 8D, and FIG. 8E are sectional views showing a method of manufacturing a display apparatus according to an exemplary embodiment of the present invention.

As shown in FIG. 8A, a first insulating substrate 101 is prepared. Then, a gate electrode 113 and a gate line 111 are formed on the first insulating substrate 101. The first insulating substrate 101 may be made of glass or plastic. The gate electrode 113 and the gate line 111 may be formed by depositing a first conductive layer on a whole surface of the substrate 101 and patterning the first conductive layer through a photolithography process.

Figure 8B:
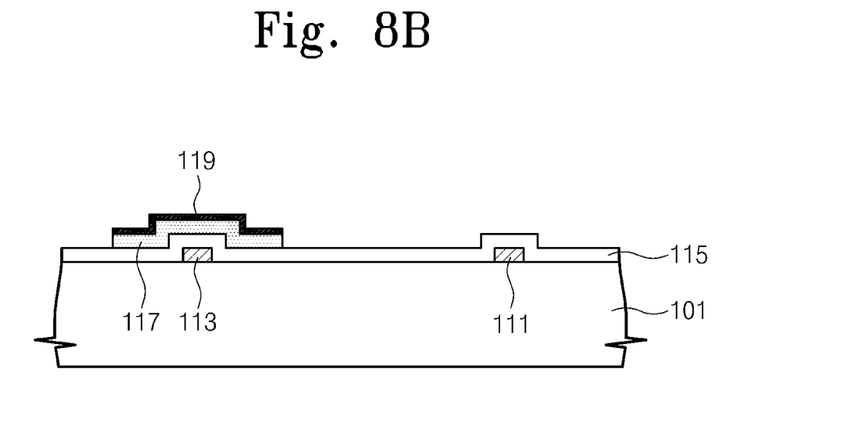

Next, as shown in FIG. 8B, a gate insulating layer 115, an amorphous silicon layer, and an n+ amorphous silicon layer are sequentially deposited on the whole surface of the first insulating substrate 101. The amorphous silicon layer and the n+ amorphous silicon layer are selectively patterned through a photolithography process to form an active layer 117 and an ohmic contact layer 119 that ohmic-contacts a source electrode 122 and a drain electrode 123, which are subsequently formed.

Figure 8C:
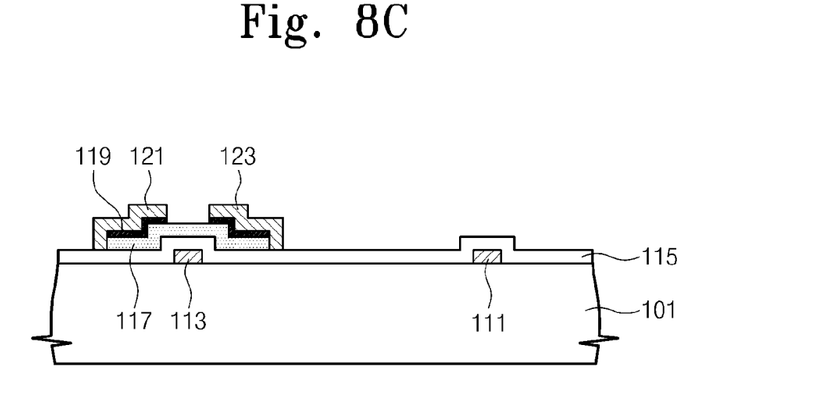

Then, as shown in FIG. 8C, a second conductive layer is formed on the whole surface of the first insulating substrate 101 having the active layer 117 and the ohmic contact layer 119. The second conductive layer is selectively patterned through a photolithography process to form the source electrode 121 and the drain electrode 123. The source electrode 122 serves as a portion of the data line 117 crossing the gate line 111 to define a pixel area.

The active layer 117, the ohmic contact layer 119, and the source and drain electrodes 122 and 123 may be formed through the two-step photolithography process described above, but the present invention is not limited thereto. For example, the ohmic contact layer 119 and the source and drain electrodes 122 and 123 may be formed through a single photolithography process with a refractive mask or a half-tone mask.

Figure 8D:
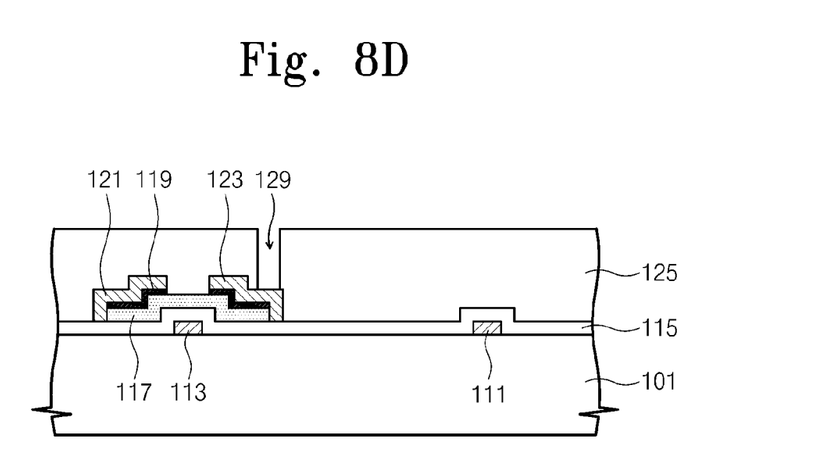

As shown in FIG. 8D, a protection layer 125 is deposited on the whole surface of the first insulating substrate 101 and the protection layer 125 is patterned through a photolithography process. During patterning, a contact hole 129 is formed in the protection layer 125 to expose a portion of the drain electrode 123.

Figure 8E:
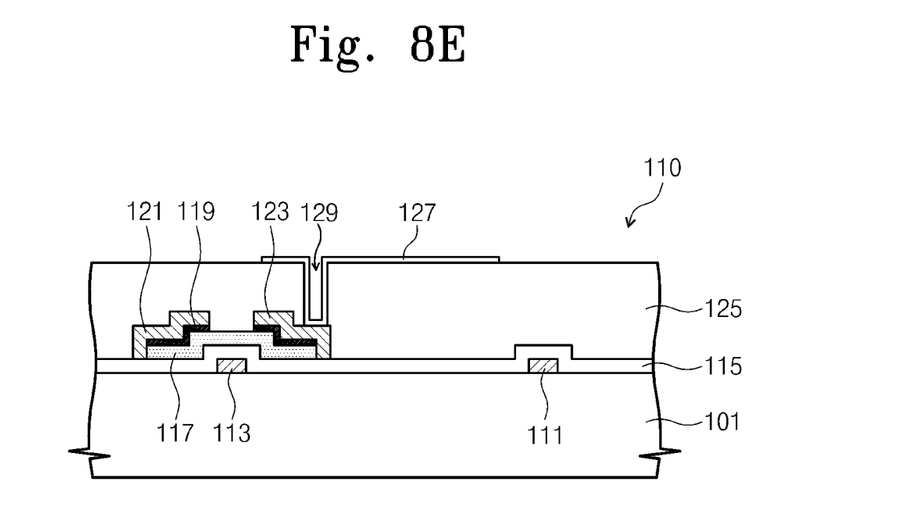

As shown in FIG. 8E, a transparent conductive material is formed on the whole surface of the first insulating substrate 101. The transparent conductive material is selectively patterned through a photolithography process, so that a pixel electrode 127 is formed. The pixel electrode 127 is electrically connected to the drain electrode 123 through the contact hole 129.

The pixel electrode 127 is formed with transparent nanomaterials including nanoparticles such as metal nanowires, metal oxide nanoparticles, carbon nanotubes, and so on. The pixel electrode 127 may be formed through a spin coating scheme, a web coating scheme, a gravure printing scheme, and so on. In addition, the transparent nanomaterials may be formed by using a non-vacuum apparatus such as a spray, roll, slit, spin coater, inkjet, etc., at a low temperature atmosphere.

A second insulating substrate is prepared (not shown). A color filter is formed on the second insulating substrate. Then, a common electrode is formed on the color filter.

Although not shown in drawings, the first insulating substrate and the second insulating substrate face each other, and a liquid crystal layer is formed between the first insulating substrate and the second insulating substrate, thereby completing the display apparatus.

In the present exemplary embodiment, the transparent conductive film has been described for the LCD, but the present invention is not limited thereto. For example, the transparent conductive film may be used to various display panels such as an OLED, a PDP, and an electrophoretic display panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display apparatus, comprising:
a first substrate comprising a plurality of pixels;
a first electrode arranged on the first substrate;
a second substrate facing the first substrate; and
a second electrode arranged on the second substrate and spaced apart from the first electrode, the second electrode to form an electric field in cooperation with the first electrode,
wherein at least one of the first electrode and the second electrode comprises a transparent conductive nanomaterial having a transmittance of no less than 73% to no more than 100%, and a sheet resistance of 25 ohms per square to 1000 ohms per square, and
wherein the transparent conductive material comprises metal nanowires, and a density of the metal nanowires is in the range of 4 particles to 40 particles per 5×5 square micrometers.

2. The display apparatus of claim 1, wherein the transparent conductive nanomaterial comprises one of metal nanowires, metal oxide nanoparticles, and carbon nanotubes.

3. The display apparatus of claim 2, wherein a cell gap between the first substrate and the second substrate is in the range of 4 µm to 6 µm.

4. The display apparatus of claim 1, wherein a maximum interval between two adjacent metal nanowires among the metal nanowires is 0.2 µm to 1 µm.

5. The display apparatus of claim 1, wherein the transparent conductive nanomaterial comprises a nanoparticle-based nanocomplex.

6. The display apparatus of claim 5, wherein the nanocomplex comprises silver particles and gold particles.

7. The display apparatus of claim 6, wherein the silver particles and the gold particles are in a nanowire form.

8. The display apparatus of claim 1, further comprising a liquid crystal layer disposed between the first substrate and the second substrate.

9. A display apparatus, comprising:
a first substrate comprising a plurality of pixels;
a first electrode arranged on the first substrate;
a second substrate facing the first substrate; and
a second electrode arranged on the second substrate and spaced apart from the first electrode, the second electrode to form an electric field in cooperation with the first electrode,
wherein at least one of the first electrode and the second electrode comprises a transparent conductive nanomaterial having a transmittance of no less than 73% to no more than 100%, and a sheet resistance of 25 ohms per square to 1000 ohms per square,
wherein the transparent conductive material comprises metal oxide nanoparticles, and a density of the metal oxide nanoparticles is in the range of 400 particles to 3000 particles per 5×5 square micrometers.

10. The display apparatus of claim 9, wherein a maximum interval between two adjacent metal oxide nanoparticles among the metal oxide nanoparticles is $1.6 \times 10^{-3}$ µm to 0.01 µm.

11. A display apparatus, comprising:
a first substrate comprising a plurality of pixels;
a first electrode arranged on the first substrate;
a second substrate facing the first substrate; and
a second electrode arranged on the second substrate and spaced apart from the first electrode, the second electrode to form an electric field in cooperation with the first electrode,
wherein at least one of the first electrode and the second electrode comprises a transparent conductive nanomaterial having a transmittance of no less than 73% to no more than 100%, and a sheet resistance of 25 ohms per square to 1000 ohms per square,
wherein the transparent conductive material comprises carbon nanotubes, and a density of the carbon nanotubes is in the range 4 particles to 150 particles per 5×5 square micrometers.

12. The display apparatus of claim 6, wherein a maximum interval between two adjacent carbon nanotubes among the carbon nanotubes is 0.027 µm to 0.33 µm.

* * * * *